(12) United States Patent
Jha et al.

(10) Patent No.: US 11,508,645 B2
(45) Date of Patent: Nov. 22, 2022

(54) MODULAR TECHNIQUE FOR DIE-LEVEL LIQUID COOLING

(71) Applicant: Intel Corporation, Santa Clara, CA (US)

(72) Inventors: Chandra M. Jha, Tempe, AZ (US); Je-Young Chang, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 97 days.

(21) Appl. No.: 16/636,296

(22) PCT Filed: Sep. 29, 2017

(86) PCT No.: PCT/US2017/054305
§ 371 (c)(1),
(2) Date: Feb. 3, 2020

(87) PCT Pub. No.: WO2019/066901
PCT Pub. Date: Apr. 4, 2019

(65) Prior Publication Data
US 2021/0183741 A1    Jun. 17, 2021

(51) Int. Cl.
*H01L 23/473* (2006.01)
*H01L 23/373* (2006.01)
*H01L 23/40* (2006.01)

(52) U.S. Cl.
CPC ........ *H01L 23/473* (2013.01); *H01L 23/3735* (2013.01); *H01L 23/40* (2013.01)

(58) Field of Classification Search
CPC . H01L 25/043; H01L 25/0657; H01L 25/074; H01L 25/0756; H01L 25/117; H01L 2225/06503–06596; H01L 25/0652; H01L 25/071; H01L 25/112; H01L 23/473; H01L 23/3735
See application file for complete search history.

(56) References Cited

U.S. PATENT DOCUMENTS

| | | | | |
|---|---|---|---|---|
| 2006/0226539 | A1* | 10/2006 | Chang | H01L 23/473 257/712 |
| 2008/0310115 | A1* | 12/2008 | Brandenburg | H01L 23/3733 361/704 |
| 2009/0057881 | A1 | 3/2009 | Arana et al. | |
| 2014/0246770 | A1* | 9/2014 | Jha | H01L 24/16 428/221 |

(Continued)

OTHER PUBLICATIONS

International Search Report and Written Opinion for International Patent Application No. PCT/US2017/054305 dated Jun. 28, 2018, 12 pgs.

*Primary Examiner* — Tucker J Wright
(74) *Attorney, Agent, or Firm* — Schwabe, Williamson & Wyatt, P.C.

(57) ABSTRACT

An integrated circuit assembly including a first die including a device side and a backside opposite the device side; and a second die including a plurality of fluidly accessible channels therein, wherein the second die is coupled to a backside of the first die. A method of fabricating an integrated circuit assembly including coupling a first die to a second die, wherein the first die includes a device side and an opposite backside, wherein the device side includes a plurality of integrated circuits and wherein the second die includes a plurality of fluidly accessible channels therein.

13 Claims, 9 Drawing Sheets

(56) References Cited

U.S. PATENT DOCUMENTS

| | | |
|---|---|---|
| 2014/0264759 A1 | 9/2014 | Koontz et al. |
| 2017/0133298 A1 | 5/2017 | Gutala et al. |
| 2017/0186728 A1 | 6/2017 | Chainer |

\* cited by examiner

MODULAR TECHNIQUE FOR DIE-LEVEL LIQUID COOLING

CROSS-REFERENCE TO RELATED APPLICATION

This patent application is a U.S. National Phase Application under 35 U.S.C. § 371 of International Application No. PCT/US2017/054305, filed Sep. 29, 2017, entitled "A NOVEL MODULAR TECHNIQUE FOR DIE-LEVEL LIQUID COOLING," which designates the United States of America, the entire disclosure of which is hereby incorporated by reference in its entirety and for all purposes.

FIELD

Thermal management for integrated circuit devices.

BACKGROUND

Decreasing feature sizes and increasing package densities are making thermal issues important in integrated circuit related products, particularly high power products such as server products. The total thermal design power is increasing with respect to generation which demands that cross-plane heat removal be improved. Still further, the emergence of multi-chip packages (MCPs) in, for example, high-power servers where, for example, multi-chip dynamic random access memory (MC-DRAM) stacked packages currently generate approximately nine watts to 10 watts of power and come coated with die backside film polymeric layers that present a high thermal resistance that is difficult to compensate for with traditional air cooling.

Many high-power central processing unit (CPU) products use an integrated heat spreader (IHS) as a lid over the die (e.g., a silicon die or dice). Onto this lid mounts a thermal solution, such as a passive heat sink, a heat sink/fan combination or liquid cooling solution. Limitations of these configurations include a relatively large stack-up height and multiple thermal interfaces where thermal interface material (TIM) must be applied. Thermal performance of TIM materials have been optimized yet a need still remains to improve the thermal management of high-power microprocessors.

DETAILED DESCRIPTION

Figure 1:
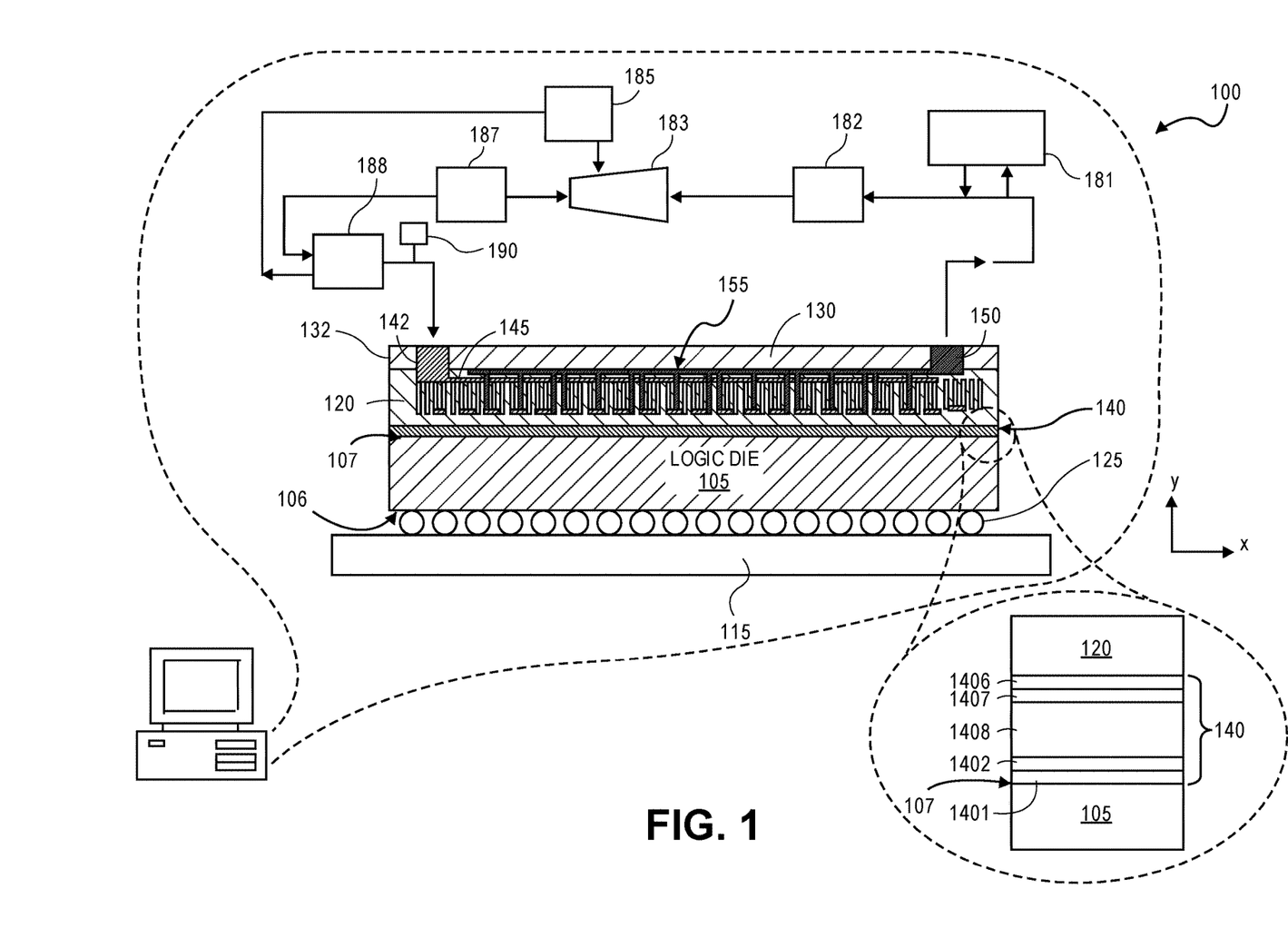
FIG. 1 shows a cross-sectional and schematic side view of an embodiment of an integrated circuit chip assembly that includes a thermal solution.

FIG. 1 shows a cross-sectional and schematic side view of an embodiment of an apparatus that includes a thermal solution. FIG. 1 shows die 105 that is, for example, a logic die (e.g., a processor) formed from a semiconductor material platform connected to substrate 130 such as a package substrate. In this embodiment, die 105 has device side 106 including a number of contacts to transistor devices and circuits in a device layer and backside 107 opposite device side 106. Device side 106 is connected to substrate 115 (e.g., a package substrate) through, for example, solder connections 125.

Connected to backside 107 of die 105 is die 120 or secondary die 120. In one embodiment, die 120 is a semiconductor material (e.g., silicon) that is not an active die (e.g., does not include any active devices formed in a device layer, where an active device is a device capable of controlling electrical current by means of an electrical signal. Die 120 includes a body and a number of laterally disposed channels formed in the body of the die. In this embodiment, the laterally disposed channels extend into and out of the page through a depth portion of die 120, including an entire portion of the depth of the die or substantially the entire portion of the depth of the die (e.g., 70 percent, 80 percent or 90 percent). FIG. 1 also shows the channels extending across a width of die 120 (defined by an x-dimension) over a portion including an entire portion or substantially the entire portion of the width dimension of the die (e.g., 70 percent, 80 percent, 90 percent). In one embodiment, the channels extend across an area of die 120 requiring thermal management, such as an area encompassed by surface 107 of die 105. As will be explained later, a portion of the channels, including an active portion, alternately bring a cooling fluid toward die 105 and take heated fluid away from die 105 for the purpose of heat transfer.

In one embodiment, backside 107 of die 105 is connected to die 120 through a thermally conductive material. In one embodiment, each of backside 107 of die 105 and a mating side of die 120 have a thermally conductive material such as a copper material (e.g., a copper layer and/or copper nanorods) and the dice are connected through a conductive material bond (e.g., a copper-copper bond). In one embodiment, each die includes a barrier layer on which the thermally conductive material (e.g., copper) is disposed. Representatively, die 105 and die 120 each have a thickness on the order of 600 microns (μm) to 900 μm.

An inset of FIG. 1 shows a magnified view of a portion of interface 140 of die 105 and die 120. In this embodiment, interface includes barrier layer 1401 formed on surface 107 of die 105. Barrier layer 1401 is, for example, a titanium material having a representative thickness on the order of about 100 nanometers (nm). Disposed directly on barrier layer 1401 is adhesive layer 1402 of, for example, a nitride material (e.g., titanium nitride). In one embodiment, adhesive layer 1402 has a thickness on the order of 250 nm. Disposed on adhesive layer 1402 is a thermally conductive material such as copper (e.g., a copper layer and/or nanorods). A mating side of die 120 similarly includes barrier layer 1406 disposed on a surface of die 120. Barrier layer 1406 is representatively a titanium material having a thickness on the order of 100 nm. Disposed directly on barrier layer 1406 is adhesive layer 1407 of, for example, titanium nitride having a thickness on the order of 250 nm. Disposed on adhesive layer 1407 is a thermally conductive material such as copper (e.g., copper layer and/or nanorods). When die 105 and die 120 are joined, interface 140 include thermally conductive material interface 1405 having a representative thickness on the order of 1 μm to 3 μm. There is no conventional thermal interface material (TIM) between die 120 and die 105.

Overlaying die 120 in the assembly of FIG. 1 is manifold 130. Manifold 130 includes inlet 142 configured to introduce a fluid into a body of manifold 130 and outlet 150 configured to remove fluid from a body of manifold 130. Disposed within a body of manifold 130 is distributor assembly 145 and collector assembly 155. Distributor assembly 145 includes, in one embodiment, a number of distributors having openings in fluid communication with a portion of channels in die 120 including, in one embodiment, each of the channels. Similarly, collector assembly 155, in one embodiment, includes a number of collectors wherein respective ones of the collectors are in fluid communication with a portion of the channels in die 120, including, in one embodiment, each of the channels. The distributors that make up distributor assembly 145 are connected to the inlet 142 and the collectors that make up collector assembly 155 are connected to outlet 150. Accordingly, in one embodiment, a fluid (e.g., liquid or gas) is configured to be introduced through inlet 142, to flow through distributor assembly 145, through a body of manifold 130 and into channels of die 120. The fluid generally travels through the channels to a base thereof and then out of the channels. The fluid travelling out of the channels travels through the body of manifold 130 and is collected in collector assembly 155 and removed from manifold 130 through outlet 150. Manifold 130 representatively is a glass material with inlet 142, outlet 150, distributor assembly 145 and collector assembly 155 formed therein. Manifold 130 has an area that covers an area of die 120 including the channels therein. In one embodiment, an area of manifold 130 is similar to an area of die 120. In one embodiment, there is no conventional TIM between manifold 130 and die 120.

Referring again to FIG. 1, apparatus 100, in one embodiment, also includes a feedback loop to circulate cooling fluid and control its temperature. Representatively, a level of coolant is stored in reservoir 181. A suitable coolant is, for example, water. Another coolant is propendiol. Other coolants may also be suitable. Fluid flow from reservoir 181 to manifold 130 is driven by pump 183. An optional chiller 182 may be placed downstream of reservoir 181. In one embodiment, pump 183 is controlled by controller 185 which is, for example, a pulse-width-modulation controller connected to an H-bridge. Downstream of pump 183 is optional flow filter 187 and flow meter 188. Flow meter 188, in one embodiment, is monitorable and controllable. Flow regime control is assisted with, for example, an H-bridge, that provides the capability to reverse the pump motor direction and apply braking/deceleration to quickly change a flow rate. Pulse-width-modulation input to a pump motor allows for precise control of the pump speed for flow rate control. As heat flux increases from die 105 and consequently the die temperature increases, a speed of pump 183 can be increased to provide additional cooling. Likewise, as the die heat flux decreases, the pump speed may be decreased to target or maintain a constant die temperature. A temperature of the cooling fluid is measured by temperature gauge 190 that is, for example, a thermocouple. Components described with respect to the representative feedback loop may be positioned above manifold 130 or in an area away from manifold 130 (e.g., on another area of printed circuit board 135). In the configuration where a representative feedback loop is positioned in an area away from manifold 130, tubing may be used to bring fluid to inlet 142 and from outlet 150.

Figure 2A:
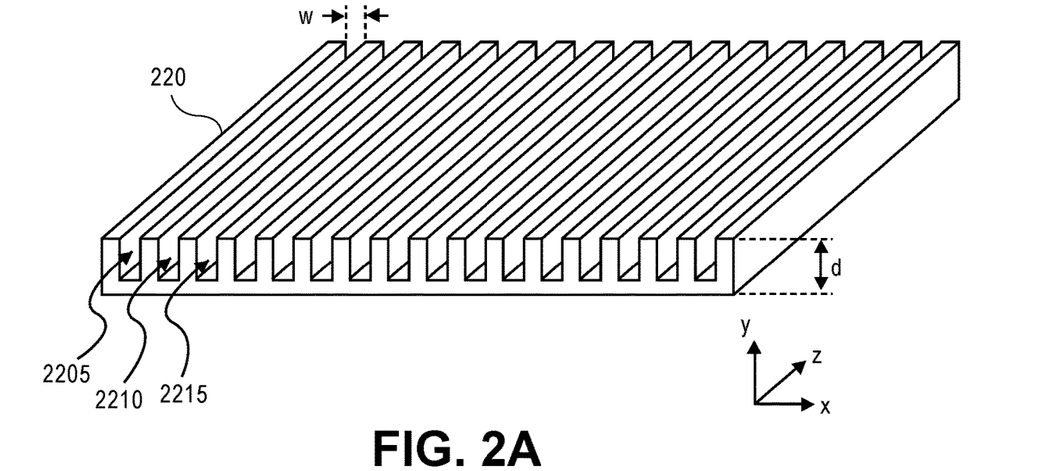
FIG. 2A shows a top perspective view of a die including channels operable to be attached to a die having active devices and circuitry as part of a thermal solution.

FIG. 2A shows a top perspective view of a die including channels (e.g., micro-channels) as part of a thermal solution. Die 220 is, in one embodiment, a semiconductor material (e.g., single crystal silicon). Die 220 includes a number of laterally disposed channels (channels 2205, 2210 and 2215 identified) formed in a body of the die. Such channels may be formed, for example, by a lithographic and etch operations or by a laser drilling operation. Representatively, each channel (e.g., channels 2205, 2210 and 2215) has a width, w, on the order of 50 microns (μm) to 200 μm and, in this embodiment, extends in a z-direction through the body of die 220. Preferably, each channel has a depth, d, substantially through the body of die 220 (e.g., 70 percent through the body, 80 percent through the body, 90 percent through the body). In this embodiment, the channels extend across an x-direction width of die 220. As illustrated, such channels are exposed at a top surface of die 220 as viewed. As illustrated, each channel (channels 2205, 2210 and 2215) has a rectangular profile. It is appreciated that such profile is dependent upon the fabrication conditions and does not necessarily have to be rectangular. For example, each channel may have a rounded base and/or the sidewalls may not be parallel.

Figure 2B:
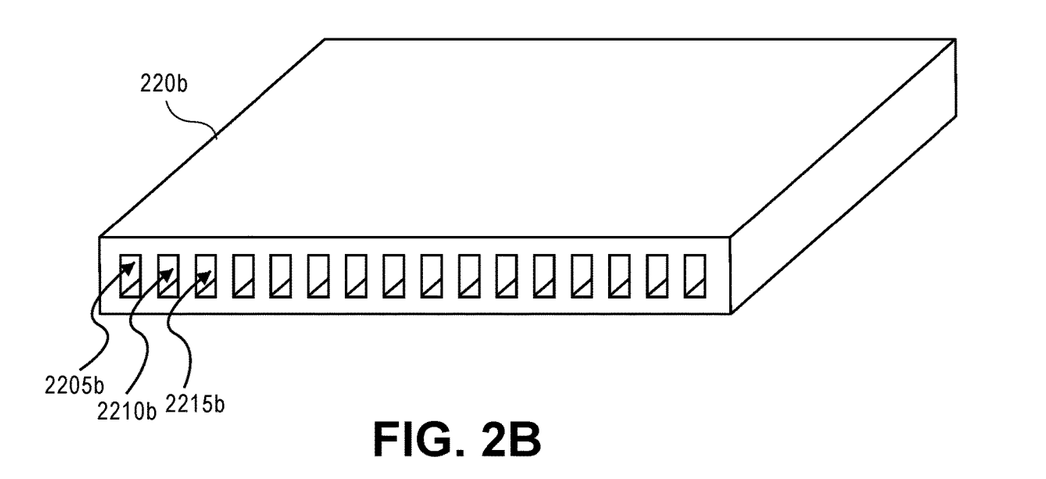
FIG. 2B shows a top perspective view of another embodiment of a die including channels therein operable to be attached to a die having active devices and circuitry offering a thermal solution.
Figure 3:
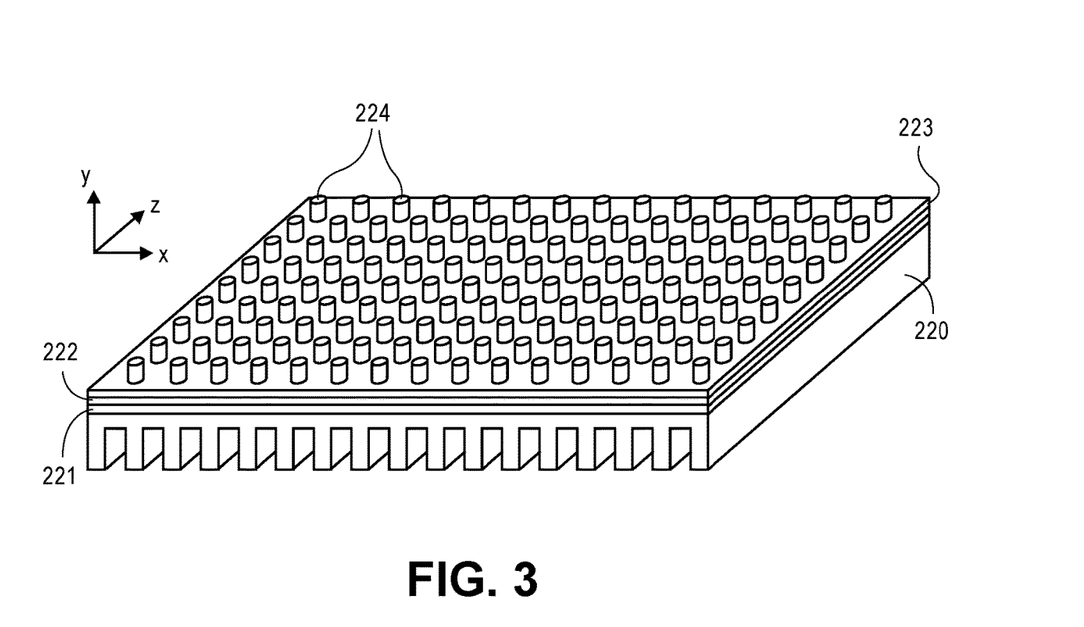
FIG. 3 shows a top perspective view of the die of FIG. 2A following the formation of a thermally conductive material.
Figure 6:
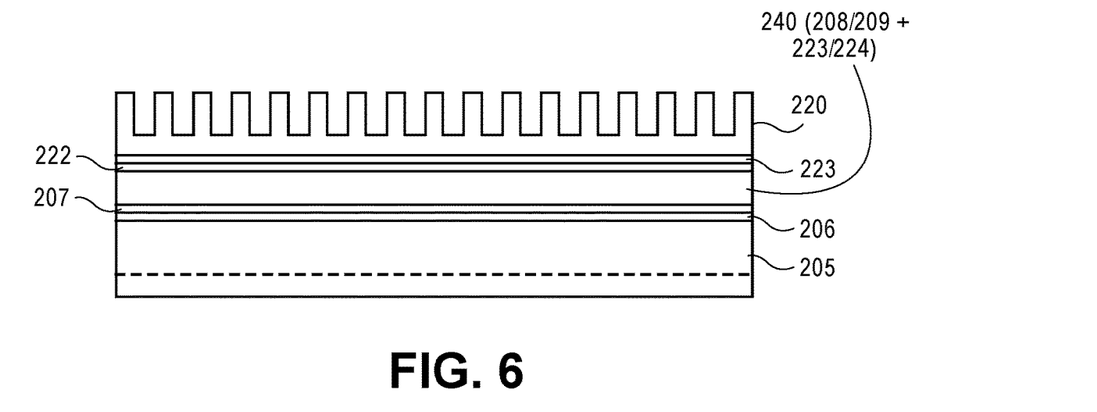
FIG. 6 shows the assembly including the connected dice of FIG. 3 and FIG. 4.
Figure 7:
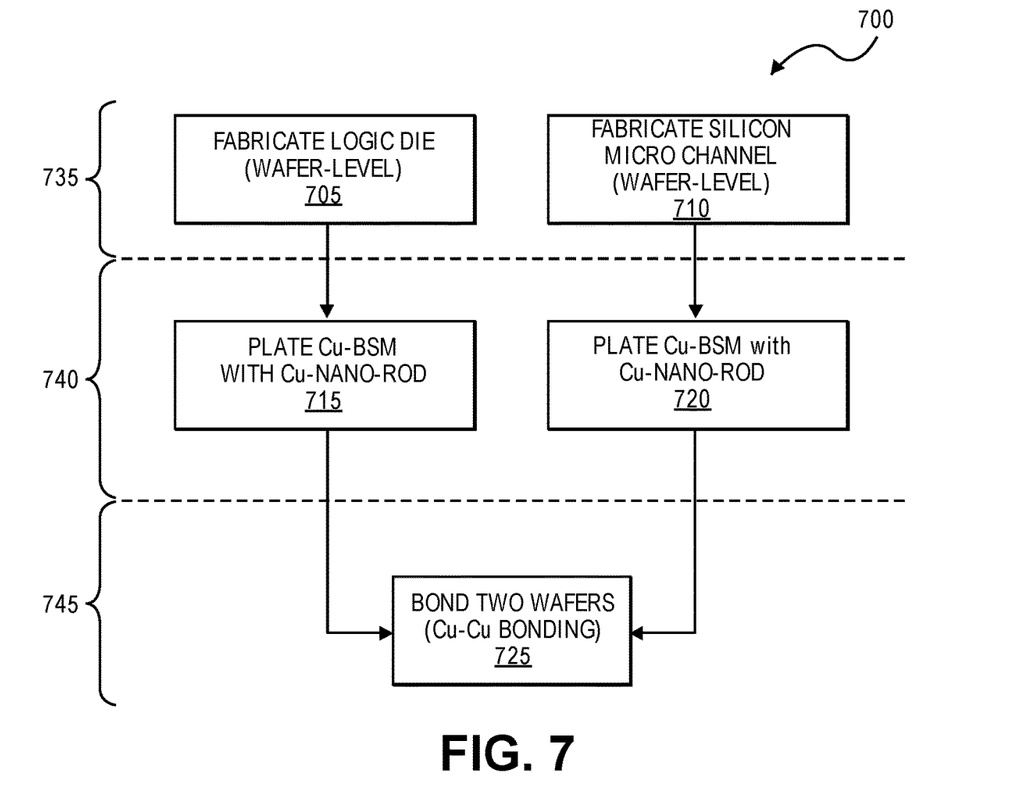
FIG. 7 provides a flow chart of a method of forming an assembly including a die with channels therein connected to a die with active devices and circuits.

FIG. 2B shows a top perspective view of another embodiment of a die offering a thermal solution. In this embodiment, die 220B includes channels disposed within a body of the die and in a z-direction through the body of the die. Such channels may be formed by, for example, an etch or laser drilling process and depositing a cap layer of a thermally conductive material such as a semiconductor material on the top to close the required openings. Access to the channels for a manifold assembly to provide a fluid to the channels may be provided by lithographic and etch operations to form desired openings. FIGS. 3-6 illustrate a process of forming an assembly including an active die (e.g., logic die (e.g., central processing unit (CPU)) and a secondary die that provides a thermal solution for the assembly flowchart of a method. FIG. 7 provides a flow chart of a method. Referring to FIG. 3 and FIG. 7, FIG. 3 shows die 220 that is, for example, a secondary die or thermal solution for the assembly. Die 220 is similar to the die shown in FIG. 2A and includes a number of laterally disposed channels extending it in a z-direction across the die. Such channels and the processes described in FIGS. 3-6 may be formed at a wafer level where die 220 is one of a number of designated dice formed in a similar manner. Once the channels are formed, the individual die may be singulated or such singulation may occur after the dice are assembled onto an active or logic die. Referring to FIG. 3, as an initial operation, channels 2205, 2210 and 2215 of another channel are formed in the die by lithographic and etch operations or by laser drilling (block 710, FIG. 7). Following the fabrication of the channels, a backside of the die (a side opposite the open channels) is processed (block 720, FIG. 7). In one embodiment, the process includes forming barrier layer 221 of, for example, titanium having a thickness on the order of 100 nanometers (nm) across a surface of the die. Following the formation of barrier layer 221, adhesive layer 222 is formed. In one embodiment, adhesive layer 222 is a nitride such as titanium nitride deposited across a surface of the die having a representative thickness on the order of 250 nm.

Following the formation of adhesive layer 222, a thermally conductive material may be formed on a die. In one embodiment, a thermally conductive material includes copper layer 223 and copper nanorods 224. In one embodiment, copper layer 223 may be formed by an electroplating process such as by seeding a surface of die 220 (an exposed surface of adhesive layer 222) with a seed material and then plating copper layer 223 across the surface. Nanorods 224 may also be plated thereon. Including nanorods 224 provides the functionality of low temperature bonding and compensation for any y-dimension height mismatch. To plate nanorods on copper layer 223, a masking layer may be initially applied over copper layer 223 then opening may be formed in the masking layer at locations for the nanorods. Nanorods 224 may then be plated into copper layer 223 and then the masking layer removed. In another embodiment, only nanorods are plated by, for example, seeding an exposed surface of adhesive layer with a seed material, masking the surface, forming openings through the masking a nanorod locations, plating nanorods and then removing the masking and excess seed material. In still another embodiment, only a copper layer (copper layer 223) is plated.

Figure 4:
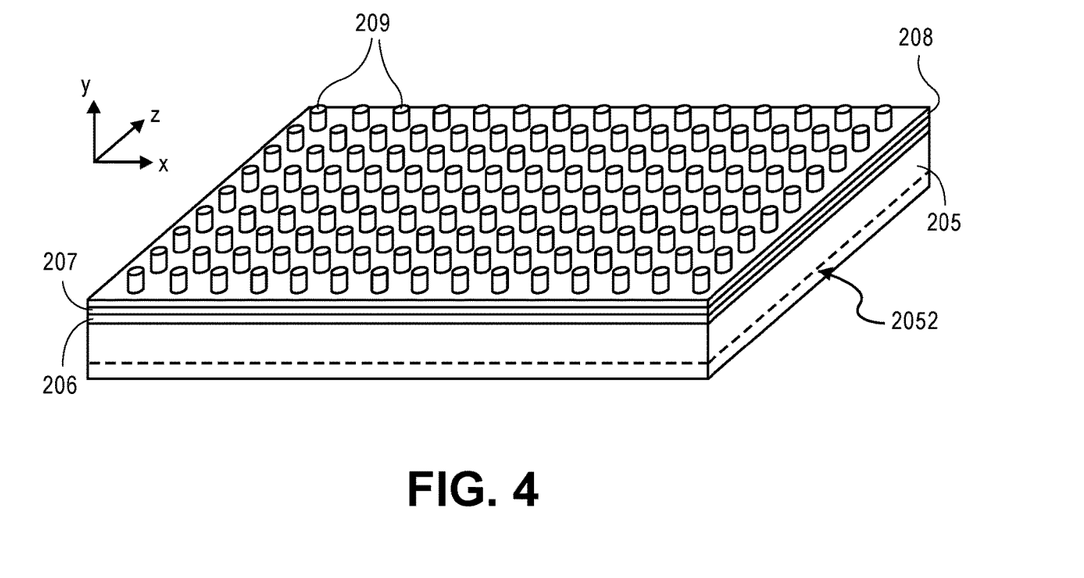
FIG. 4 shows a top perspective view of an embodiment of a die including active devices and circuits processed to receive the die of FIG. 3 by the formation of a conductive material on a backside of the die.

FIG. 4 shows an embodiment of a top perspective view of an embodiment of a die including active devices and circuits process to receive the die of FIG. 3. FIG. 4 shows die 205 that is, for example, a logic or other die (e.g., a memory die) including device layer 2052 of a number of active devices and circuitry. Die 205 may be formed according to conventional processes at a wafer level. Once formed, die 205 is processed to accept a secondary die such as die 220 offering thermal solution at a singulated die or wafer level. FIG. 4 shows a backside of die 205 including barrier layer 206 of, for example, a titanium material having a representative thickness on the order of 100 nm and barrier layer 207 of a nitride material such as titanium nitride having a representative thickness on the order of 250 nm. Disposed on adhesive layer 207 is a thermally conductive material such as copper. In this embodiment, thermally conductive material includes layer 208 of, for example, electroplated copper and nanorods 209 formed as described above (block 715, FIG. 7).

Figure 5:
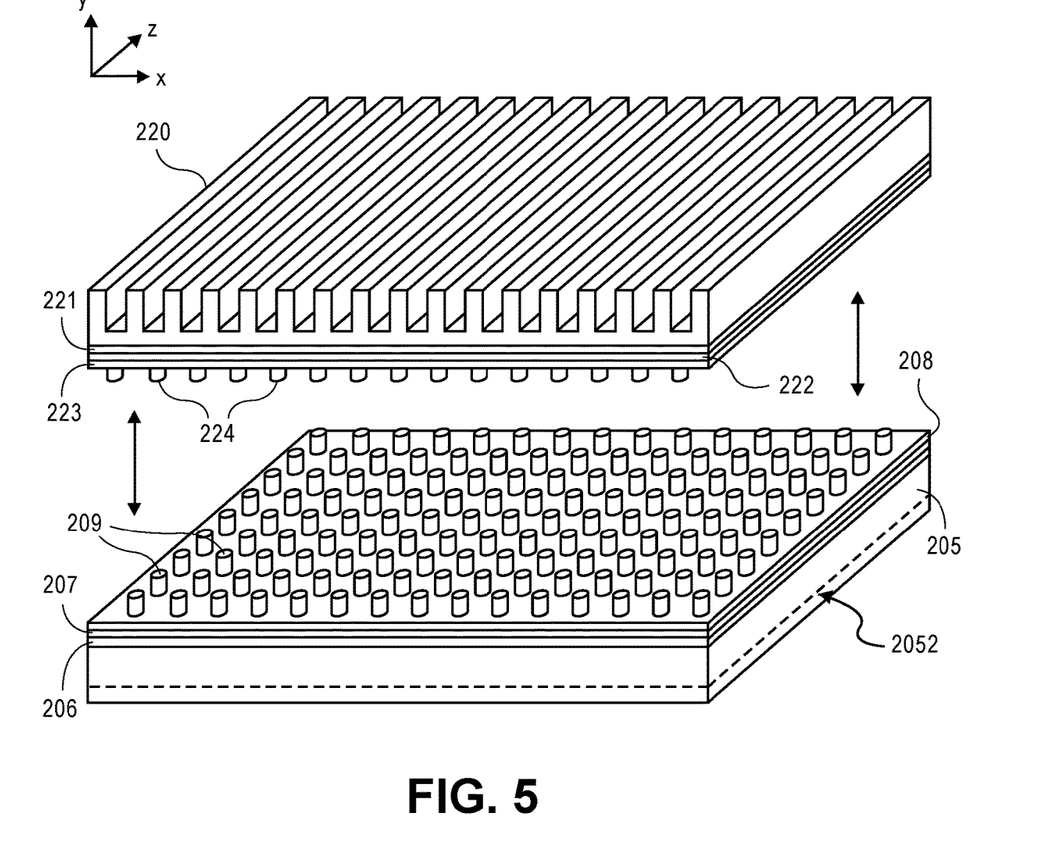
FIG. 5 shows the connecting of the die of FIG. 3 to the die of FIG. 4.

FIG. 5 shows the connecting of die 220 to die 205. In one embodiment, done at, for example, a wafer level, die 220 is positioned so that a backside of die 220 including the thermally conductive material (copper layer 223 and/or nanorods 224), in this embodiment, is facing a similar thermally conductive material on die 205. The two dice are aligned and thermally bonded together (block 725, FIG. 7). FIG. 6 shows the assembly including the connected die 205 and die 220. In this embodiment, the connection forms interface 240 of the thermally conductive material on the surface of each die. If processed at a wafer level for each die, following the connection (e.g., thermal bonding) of the dice, the two wafers may be singulated to produce a separate composite structure or assembly as shown in FIG. 6.

Figure 8:
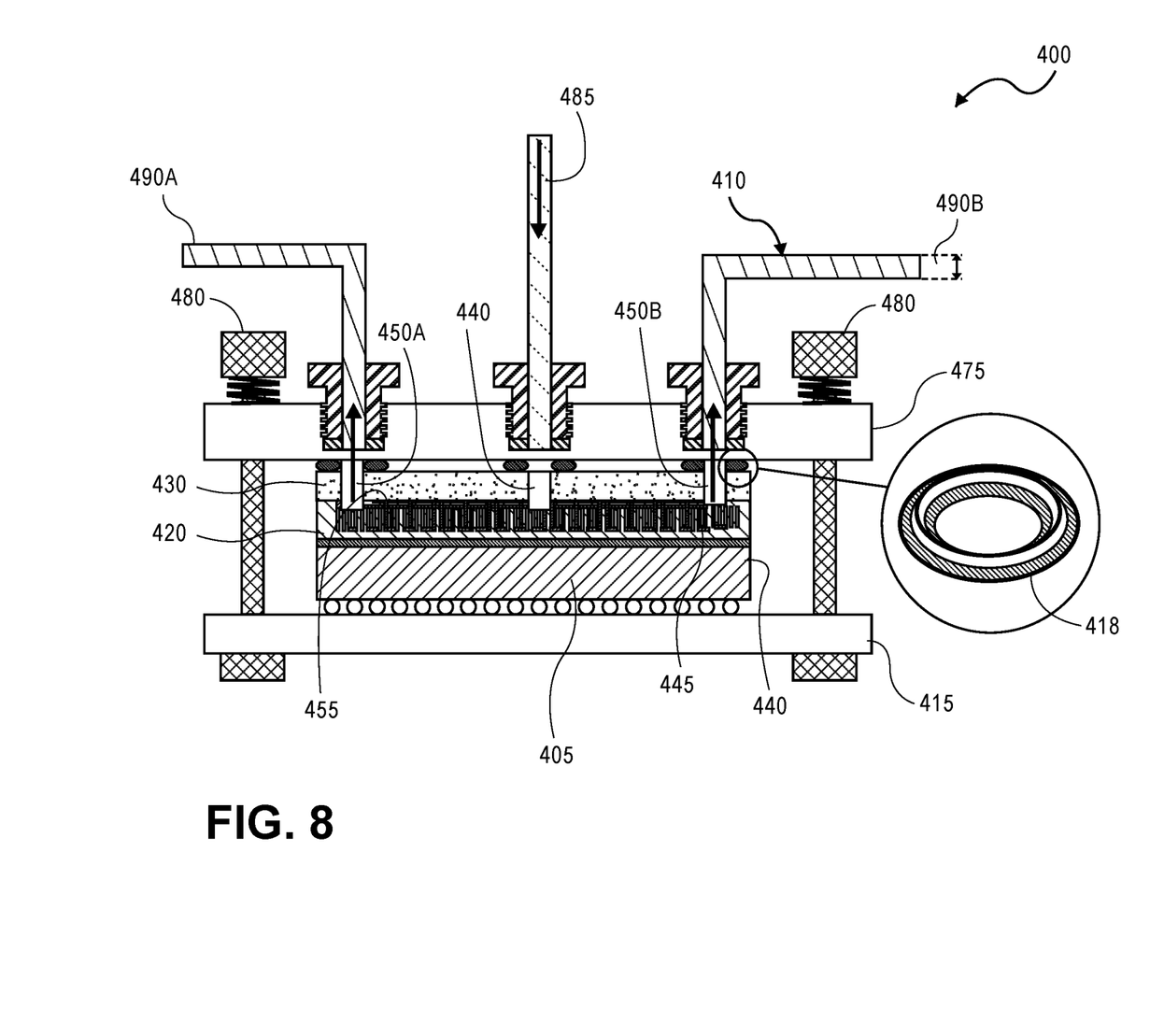
FIG. 8 shows another embodiment of an assembly including a die including channels connected to a die with active devices and circuitry formed therein for a fluid cooling solution.

FIG. 8 shows another embodiment of an assembly including a thermal solution of a die having channels (e.g., micro-channels or micro-jets) formed therein for a fluid cooling solution. Referring to FIG. 8, assembly 400 includes active die 405 that is, for example, a logic die such as CPU. Overlaying die 405 is die 420 that includes a thermal solution of, for example, channels formed therein. Die 405 and die 420 may be connected (connected on a backside or non-device side of logic die 405) by interface 440 of a thermally conductive material such as copper as described above. A device side of die 405 is connected to substrate 415 such as a package substrate or printed circuit board by, for example, solder connections (e.g., a ball grid array). Die 420 includes, in one embodiment, a number of a laterally disposed channels as described above. In one embodiment, the channels are exposed on a surface of the die (similar to FIG. 2A). Disposed on die 420, in this embodiment, is manifold 430. Manifold 430 includes therein a distributor assembly and a collector assembly. Distributor assembly 445 includes, in one embodiment, a number of distributors having openings in fluid communication with a portion of the channels in die 420 (e.g., all of the channels) and collector assembly 455, in one embodiment, includes a number of collectors wherein the respective ones of the collectors are also in fluid communication with a portion of the channels in die 420. The distributors that make up distributor assembly 445 are connected to inlet 440 and collectors that make up collector assembly 455 are connected to outlet 450A or outlet 450B.

In this embodiment, connected to the assembly of die 420 and die 405 is support 475. In one embodiment, support 475 is connected to the assembly through substrate 415 by support screws 480. Support 475, in one embodiment, has an area dimension larger than the individual die (e.g., 30 percent larger, 50 percent larger) so as to cover a surface of manifold 430 and die 420 and die 405 between the support and substrate 415. Disposed in support 475 is inlet pipe 485 (e.g., plastic tubing) and outlet pipe 490A and outlet pipe 490B. The inlet pipes and outlet pipes through support 475 are aligned with inlet 440 and outlets 450A and 450B of manifold 430, respectively. The interface of the inlet and outlet pipes with the inlet and the outlets of the manifold are sealed by, for example, O-rings 418. In this embodiment, fluid, such as water, is introduced into inlet 485. The fluid flows through distributor assembly 445 in manifold 430 and into channels of die 420. The fluid then flows through corrector assembly 455 in manifold 430 and is removed through outlet 450A or outlet 450B into outlet pipe 490A and outlet pipe 490B, respectively. The assembly of FIG. 8 may include a feedback loop such as described above with reference to FIG. 1 to circulate cooling fluid and control as temperature.

Figure 9:
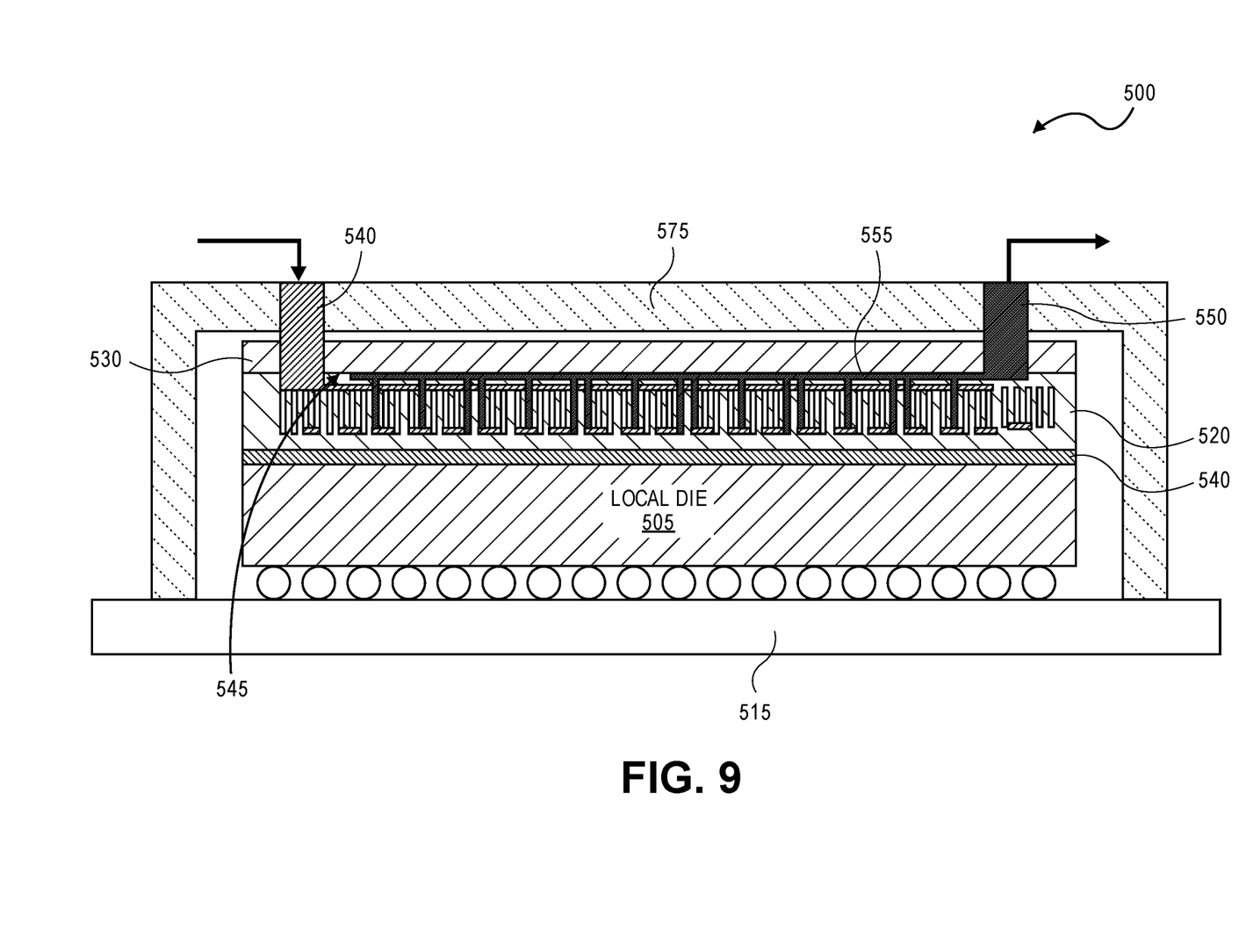
FIG. 9 shows a cross-sectional side view of another embodiment of an assembly offering a thermal solution.

FIG. 9 shows a cross-sectional side view of another embodiment of an assembly offering a thermal solution. Referring to FIG. 9, the figure shows die 505 that is, for example, logic die or CPU having a device layer wherein the device layer is connected to substrate 515 such as a package substrate or printed circuit board. Disposed on a backside of die 505 is die 520 that provides a thermal solution in the form of a number of channels formed as described above. Die 505 and die 520 are connected to one another through interface 540 of a thermally conductive material such as copper. Disposed on a surface of die 520 (a top surface as viewed) is manifold 530 of, for example, a glass material. Disposed within manifold 530 is distributor assembly 545 including, in one embodiment, a number of distributors having an openings in fluid communication with a portion of the channels in die 520 (e.g., all of the channels in die 520). Also disposed in manifold 530 is collector assembly 555 including a number of collectors, wherein the respective ones of the collectors are in fluid communication with a portion of the channels in die 520. Distributors that make up distributor assembly 545 are connected to inlet 540 and collectors that make up collector assembly 555 are connected to outlet 550. Disposed over manifold 530, in this embodiment, is integrated heat spreader (IHS) of, for example, a thermally conductive material which is a metal. In one embodiment, IHS 575 completely surrounds the assembly of die 505, die 520 and manifold 530. In this manner, the assembly is encased within IHS 575. In one embodiment, there is no TIM between IHS 575 and manifold 530 or between manifold 530 and die 520. As viewed, inlet 540 and outlet 550 extend from manifold 530 through IHS 575. Accordingly, a fluid may be introduced through inlet 540 at a surface of IHS 575 (a top surface, as viewed) and through manifold 530 and die 520 and return to outlet 550 through IHS 575. The assembly of FIG. 9 may include a feedback loop such as described above with reference to FIG. 1 to circulate cooling fluid and control as temperature.

Figure 10:
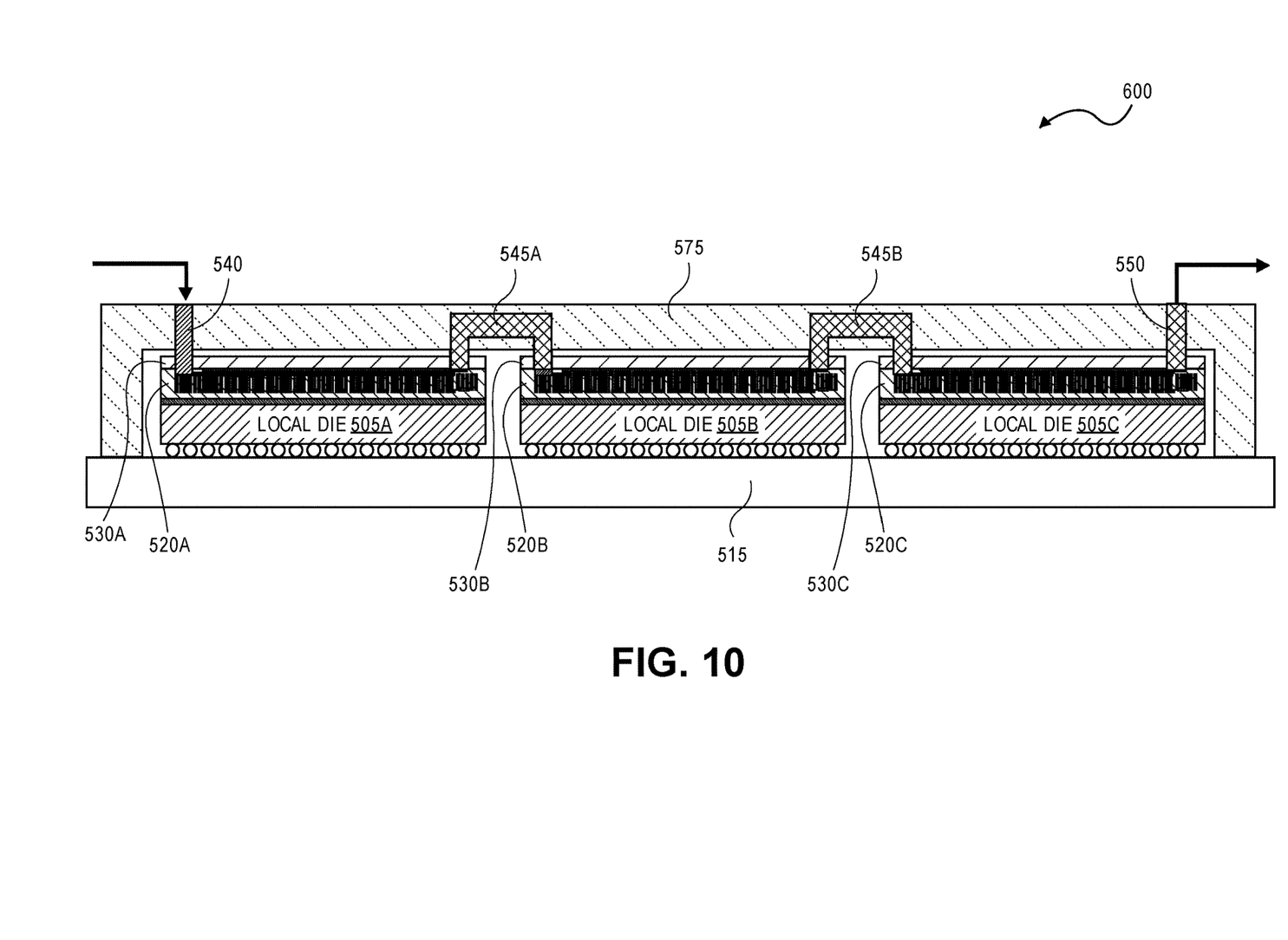
FIG. 10 shows a cross-sectional side view of another embodiment of an assembly offering a thermal solution.

FIG. 10 shows a cross-sectional side view of another embodiment of an assembly including a multi-chip package (MCP). In this embodiment, an MCP is illustrated including three different die assemblies connected to the same package. FIG. 10 shows a first assembly including die 505A that is, for example, an active die connected to die 520A that has a thermal solution of, for example, micro-channels or micro-jets as described above; die 505B that has an active die connected to die 520B that includes a thermal solution; and die 505C connected to die 520C that includes a thermal solution. Dice 505A, 505B and 505C may each be a logic die (e.g., a processor) or other functional die (e.g., a memory die). Each of a device side of die 505A, die 505B and die 505C is connected to substrate 515 (e.g., a package substrate) through, for example, solder connections. Overlaying each of die 520A, die 520B and die 520C is a manifold. FIG. 10 shows manifold 530A on die 520A, manifold 530B on die 520B, and manifold 530C on die 520C. Each manifold representatively includes a distributor assembly and a collector assembly as described above.

Overlaying the three dice in the multi-chip package assembly is IHS 575 of, for example, a thermally conductive material. In this embodiment, IHS 575 completely surrounds or encompasses the three dice. In one embodiment, there is no TIM between the manifolds and IHS 575 or between the manifolds and dice 520A-520C, respectively.

FIG. 10 shows inlet 540 connected to manifold 530A. Inlet 540 is configured to deliver a fluid such as water to manifold 530A and the distributor assembly therein. The fluid flows through the micro-channels or micro-jets of die 520A and into a collector assembly of manifold 530A. From the collector assembly, the fluid moves through outlet 545A. In this embodiment, outlet 545A also serves as an inlet to the assembly including die 505B and die 520B. Outlet 545A is connected as an inlet to manifold 530B and fluid flows into manifold 530B, through the distributor assembly therein and into the micro-channels or micro-jets of die 520B and is collected through the collector assembly therein. The collector assembly in manifold 530B transfers the fluid to outlet 545B. Outlet 545B, in this embodiment, also serves as the inlet to the assembly including die 505C and die 520C. Outlet 545B delivers fluid to manifold 530C. The fluid travels through the distributor assembly therein and is collected through the collector assembly and release through outlet 550. Outlet 550 is disposed through IHS 575.

Figure 11:
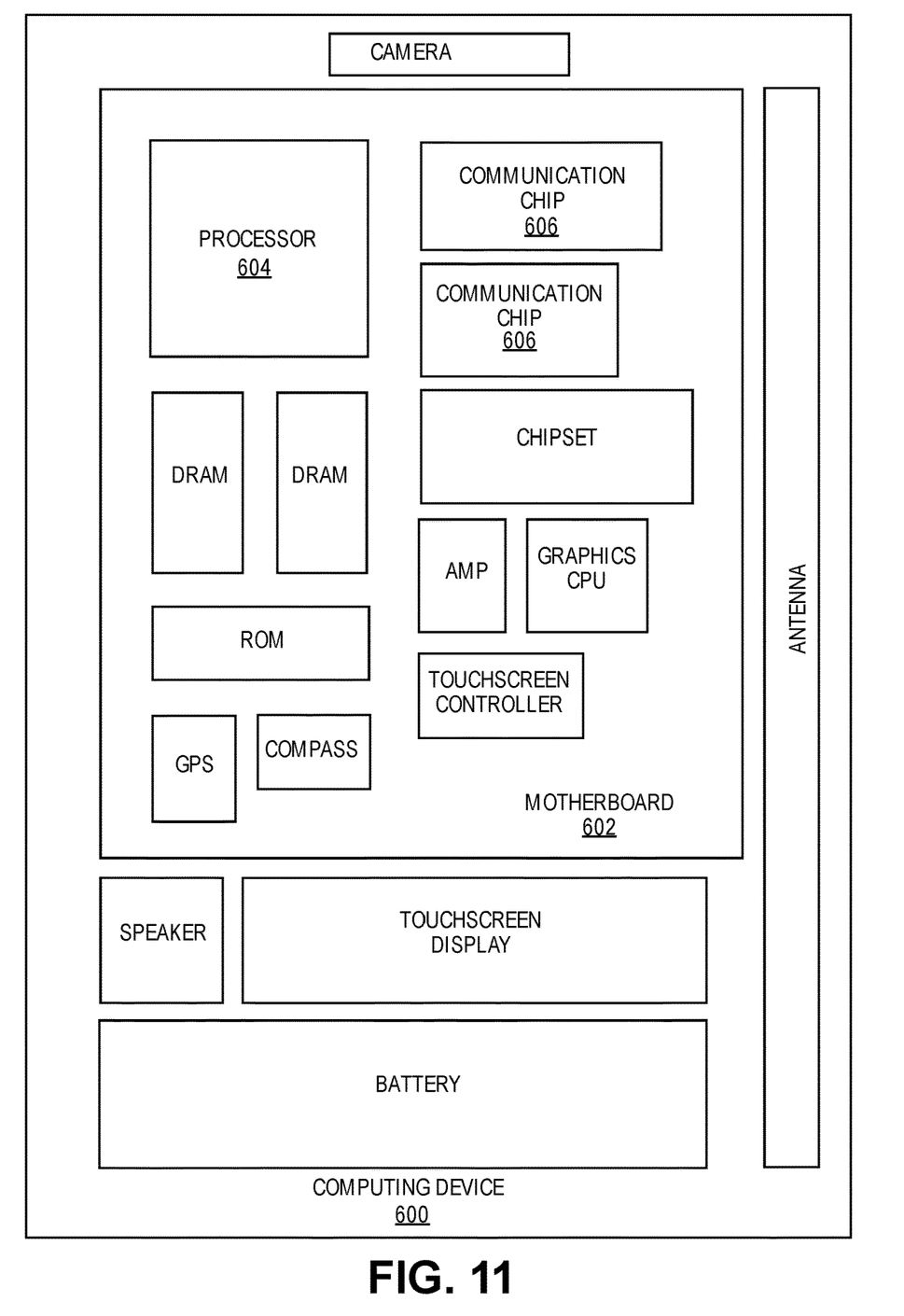
FIG. 11 illustrates an embodiment of a computing device.

FIG. 11 illustrates computing device 600 in accordance with one implementation. Computing device 600 houses board 602. Board 602 may include a number of components, including but not limited to processor 604 and at least one communication chip 606. Processor 604 is physically and electrically coupled to board 602. In some implementations at least one communication chip 606 is also physically and electrically coupled to board 602. In further implementations, communication chip 606 is part of processor 604. Depending on its applications, computing device 600 may include other components that may or may not be physically and electrically coupled to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, first communication chip 606 may be dedicated to shorter range wireless communications such as Wi-Fi and Bluetooth and second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die of the processor may include or be part of a thermal solution such as described above. The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, the integrated circuit die of the communication chip may include or be part of a thermal solution such as described above.

In further implementations, another component housed within computing device 600 may contain an integrated circuit die may include or be part of a thermal solution such as described above.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An integrated circuit assembly comprising:
   a first die comprising a device side and a backside opposite the device side, the first die having a lateral width;
   a second die comprising a plurality of fluidly accessible channels therein, the second die having a lateral width, wherein the second die is coupled to a backside of the first die by copper to copper bonds, and wherein the lateral width of the first die is at least as great as the lateral width of the second die; and
   a manifold over the second die, the manifold comprising an inlet, an outlet, a distributor assembly, and a collector assembly, the distributor assembly comprising a plurality of distributors having openings in fluid communication with a first portion of the plurality of fluidly accessible channels of the second die, and the collector assembly comprising a plurality of collectors having openings in fluid communication with a second portion of the plurality of fluidly accessible channels of the second die.

2. The integrated circuit assembly of claim 1, further comprising a lid disposed on the second die, the lid comprising an area dimension that covers an area comprising the channels.

3. The integrated circuit assembly of claim 2, wherein the lid comprises a fluid inlet and a fluid outlet.

4. The integrated circuit assembly of claim 1, wherein a material of the first die and a material of the second die are each a semiconductor material.

5. An integrated circuit assembly comprising:
   at least one package comprising:
   a first die comprising a device side and a backside opposite the device side, the first die having a lateral width;
   a second die coupled to the backside of the first die by copper to copper bonds, the second die comprising a plurality of channels therein and a fluid inlet operable to deliver a fluid to the plurality of channels and a fluid outlet, and the second die having a lateral width, wherein the lateral width of the first die is at least as great as the lateral width of the second die;
   a manifold over the second die, the manifold comprising an inlet, an outlet, a distributor assembly, and a collector assembly, the distributor assembly comprising a plurality of distributors having openings in fluid communication with a first portion of the plurality of channels of the second die, and the collector assembly comprising a plurality of collectors having openings in fluid communication with a second portion of the plurality of channels of the second die; and
   a package substrate coupled to the device side of the die.

6. The integrated circuit assembly of claim 5, wherein the at least one package further comprises a lid disposed on the second die, the lid comprising an area dimension that covers an area comprising the channels.

7. The integrated circuit assembly of claim 6, wherein the lid comprises the fluid inlet and the fluid outlet.

8. The integrated circuit assembly of claim 5, further comprising a support disposed on the at least one package such that the first die and the second die are disposed between the package substrate and the support.

9. The integrated circuit assembly of claim 5, further comprising an integrated heat spreader coupled to the package substrate and encapsulating a portion of the at least one package, the integrated heat spreader comprising an inlet port coupled to the fluid inlet and an outlet port coupled to the fluid outlet.

10. The integrated circuit assembly of claim 9, wherein the at least one package comprises a first package and a second package.

11. The integrated circuit assembly of claim 10, wherein the inlet port of the integrated heat spreader is coupled to the fluid inlet of the first package and the fluid outlet of the first package is coupled to fluid inlet of the second package and the outlet port of the integrated heat spreader is coupled to the fluid outlet of the second package.

12. An integrated circuit assembly comprising:
    at least one package comprising:
    a first die comprising a device side and a backside opposite the device side;
    a second die coupled to the backside of the first die, the second die comprising a plurality of channels therein and a fluid inlet operable to deliver a fluid to the plurality of channels and a fluid outlet;
    a package substrate coupled to the device side of the die; and
    an integrated heat spreader coupled to the package substrate and encapsulating a portion of the at least one package, the integrated heat spreader comprising an inlet port coupled to the fluid inlet and an outlet port coupled to the fluid outlet, wherein the at least one package comprises a first package and a second package.

13. The integrated circuit assembly of claim 12, wherein the inlet port of the integrated heat spreader is coupled to the fluid inlet of the first package and the fluid outlet of the first package is coupled to fluid inlet of the second package and the outlet port of the integrated heat spreader is coupled to the fluid outlet of the second package.

\* \* \* \* \*